US009416449B2

(12) United States Patent
De Graaf et al.

(10) Patent No.: US 9,416,449 B2
(45) Date of Patent: Aug. 16, 2016

(54) CONTINUOUS PATTERNED LAYER DEPOSITION

(75) Inventors: Ariël De Graaf, Utrecht (NL); Erwin John Van Zwet, Pijnacker (NL); Paulus Willibrordus George Poodt, Nijmegen (NL); Adrianus Johannes Petrus Maria Vermeer, Geldrop (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 498 days.

(21) Appl. No.: 13/579,429

(22) PCT Filed: Feb. 17, 2011

(86) PCT No.: PCT/NL2011/050112
§ 371 (c)(1),
(2), (4) Date: Oct. 12, 2012

(87) PCT Pub. No.: WO2011/102718
PCT Pub. Date: Aug. 25, 2011

(65) Prior Publication Data
US 2013/0043212 A1 Feb. 21, 2013

(30) Foreign Application Priority Data
Feb. 18, 2010 (EP) .................................... 10154037

(51) Int. Cl.
C23C 16/54 (2006.01)
C23C 16/455 (2006.01)
C23C 16/04 (2006.01)

(52) U.S. Cl.
CPC ........... *C23C 16/45551* (2013.01); *C23C 16/04* (2013.01); *C23C 16/545* (2013.01)

(58) Field of Classification Search
USPC .......................... 430/315; 216/67; 118/723 R
See application file for complete search history.

(56) References Cited

U.S. PATENT DOCUMENTS

| | | | |
|---|---|---|---|
| 4,389,973 A | 6/1983 | Suntola et al. | |
| 4,628,238 A | 12/1986 | Smulders et al. | |
| 4,718,972 A | 1/1988 | Babu et al. | |
| 5,157,851 A | 10/1992 | Younan | |
| 5,997,963 A | 12/1999 | Davison et al. | |
| 6,495,233 B1 * | 12/2002 | Shmurun et al. | 428/64.1 |
| 6,582,767 B1 | 6/2003 | Fukushima et al. | |
| 8,017,183 B2 | 9/2011 | Yang et al. | |
| 2001/0010112 A1 | 8/2001 | Maeda | |
| 2002/0069826 A1 | 6/2002 | Hunt et al. | |
| 2002/0069827 A1 | 6/2002 | Sakamoto et al. | |
| 2004/0052972 A1 | 3/2004 | Schmitt | |
| 2004/0058293 A1 | 3/2004 | Nguyen et al. | |
| 2004/0112537 A1 | 6/2004 | Yamazaki et al. | |
| 2005/0011752 A1 | 1/2005 | Yamazaki et al. | |
| 2005/0227049 A1 | 10/2005 | Boyack et al. | |
| 2007/0218702 A1 | 9/2007 | Shimizu et al. | |
| 2007/0281089 A1 | 12/2007 | Heller et al. | |
| 2008/0075858 A1 | 3/2008 | Koh | |
| 2008/0166884 A1 | 7/2008 | Nelson et al. | |
| 2008/0260963 A1 | 10/2008 | Yoon et al. | |
| 2009/0081374 A1 | 3/2009 | Yang et al. | |
| 2009/0081827 A1 | 3/2009 | Yang et al. | |
| 2009/0081885 A1 | 3/2009 | Levy et al. | |
| 2009/0165715 A1 | 7/2009 | Oh | |
| 2010/0173494 A1 | 7/2010 | Kobrin | |
| 2011/0120544 A1 * | 5/2011 | Levy et al. | 136/256 |

FOREIGN PATENT DOCUMENTS

| | | |
|---|---|---|
| EP | 0370542 A1 | 5/1990 |
| EP | 0490118 A1 | 6/1992 |
| EP | 2159304 A1 | 3/2010 |
| EP | 2211369 A1 | 7/2010 |
| GB | 0588242 A | 5/1947 |
| GB | 1023897 A | 3/1966 |
| GB | 1114782 A | 5/1968 |
| TW | 200926299 A | 6/2009 |

(Continued)

OTHER PUBLICATIONS

Xirong Jiang et al, Area-Selective ALD with Soft Lithographic Methods: Using Self-Assembled Monolayers to Direct Film Deposition, Department of Physics, and Department of Chemical Engineering, Stanford UniVersity, 2009 American Chemical Society Published on Web Sep. 3, 2009.

(Continued)

*Primary Examiner* — Daborah Chacko Davis
(74) *Attorney, Agent, or Firm* — Banner & Witcoff, Ltd.

(57) ABSTRACT

A method of manufacturing a substrate with a patterned layer of deposited material, the patterned layer being deposited from a processing head, the method comprising applying bearing gas from the processing head to keep the processing head hovering over the substrate on a gas bearing;

moving the substrate and the hovering processing head relative to each other;

applying a primer material for selective deposition of a deposition material to the substrate, the primer material being applied from a first area of a surface of the processing head that faces the substrate, and spatially patterning the primer on the substrate after or during application;

applying the deposition material to the substrate from a second area of the surface of the processing head that faces the substrate, the second area lying downstream of the first area in a direction of the movement of the substrate relative to the processing head.

20 Claims, 2 Drawing Sheets

(56) References Cited

FOREIGN PATENT DOCUMENTS

| WO | 00/42632 A1 | 7/2000 |
| --- | --- | --- |
| WO | 0183852 A1 | 11/2001 |
| WO | 2004/012235 A2 | 2/2004 |
| WO | 2007106076 A2 | 9/2007 |
| WO | 2008/027215 A2 | 3/2008 |
| WO | 2008085474 A2 | 7/2008 |
| WO | 2009142487 A1 | 11/2009 |
| WO | 2009142488 A1 | 11/2009 |
| WO | 2011/053446 A1 | 5/2011 |

OTHER PUBLICATIONS

Hiroyuki Sugimura et al, Photolithography based on organosilane self-assembled monolayer resist, Department of Materials Processing Engineering, Graduate School of Engineering, Nagoya University, Department of Ecosystem Engineering, Graduate School of Engineering, The University of Tokushima, Elsevier Science Ltd, Electrochimica Acta 47 (2001) 103-107.

A. Pagani et al., Patterned Metallized Films: State-of-the-art and Growth Opportunities, Society of Vacuum Coaters, 50th Annual Technical Conference Proceedings (2007) ISSN 0737-5921.

International Search Report—PCT/NL2011/050112—Mailing Date: May 26, 2011.

International Search Report—PCT/NL2011/050100—Date of mailing: May 23, 2011.

International Search Report PCT/NL2011/050138—Mailing date: May 6, 2011.

International Search Report, Application No. PCT/NL2010/050491, dated Oct. 15, 2010.

European Search Report, Application No. EP07120262, dated Apr. 15, 2008.

International Search Report, Application No. PCT/NL2008/050712, dated Feb. 4, 2009.

International Search Report, Application No. PCT/NL2011/050128, dated Mar. 23, 2011.

International Search Report, Application No. PCT/NL2009/050755, dated May 25, 2010.

International Search Report, Application No. PCT/NL2009/050511, dated Oct. 14, 2009.

International Search Report, Application No. PCT/NL2011/050693, dated Nov. 7, 2011.

U.S. Appl. No. 12/741,829, Hydrophobic Surface Finish and Method of Application, filed Jun. 21, 2010.

U.S. Appl. No. 13/060,435, Apparatus and Method for Atomic Layer Deposition, filed Sep. 19, 2011.

U.S. Appl. No. 13/132,004, Apparatus and Method for Atomic Layer Deposition, filed Aug. 19, 2011.

U.S. Appl. No. 13/387,414, Apparatus and Method for Atomic Layer Deposition, filed Apr. 11, 2012.

U.S. Appl. No. 13/577,922, Method and Apparatus for Depositing Atomic Layers on a Substrate, filed Sep. 11, 2012.

U.S. Appl. No. 13/579,765, Method and Device for Layer Deposition, filed Sep. 30, 2012.

U.S. Appl. No. 13/581,093, Apparatus and Method for Reactive Ion Etching, filed Aug. 24, 2012.

\* cited by examiner

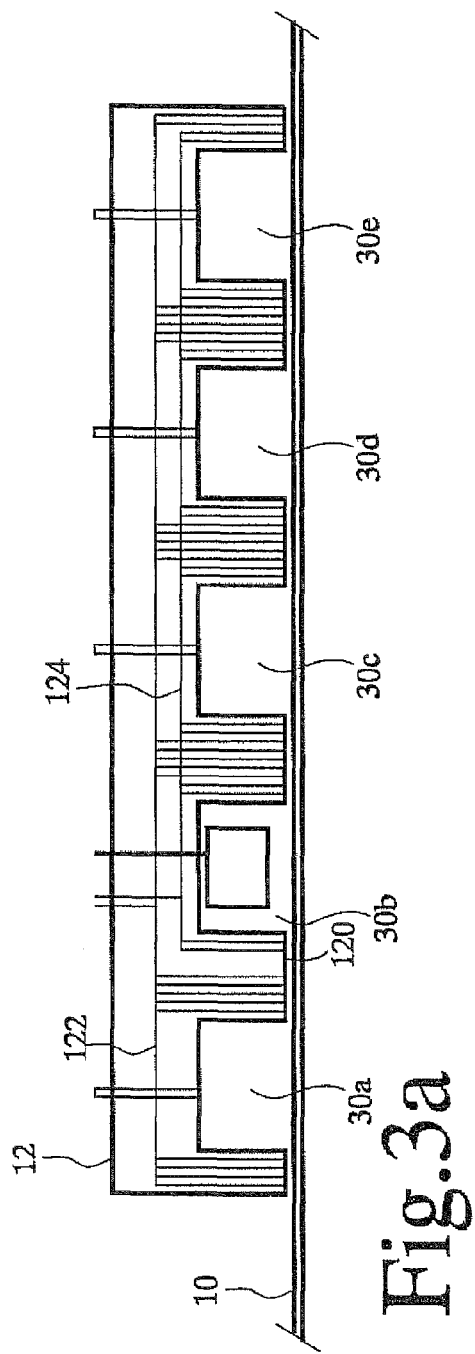
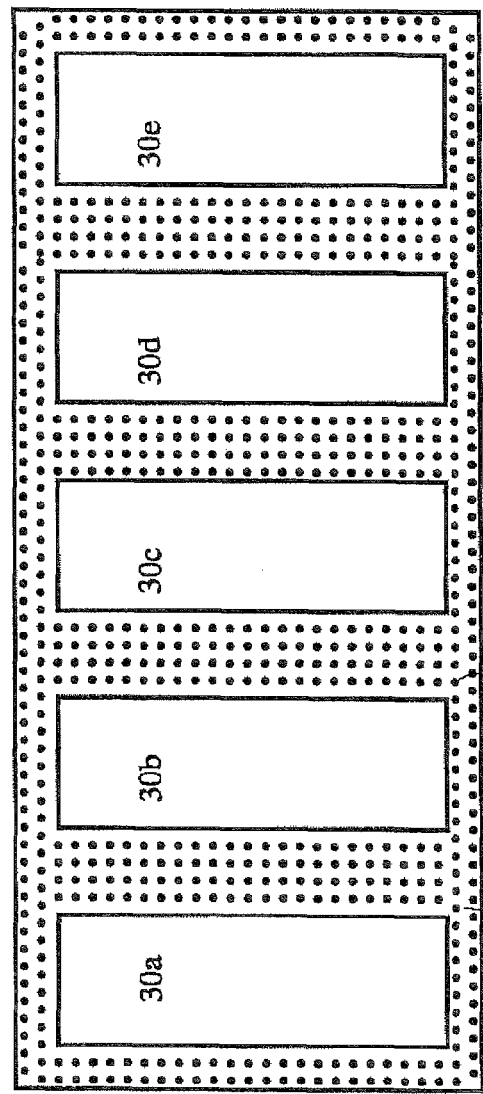

CONTINUOUS PATTERNED LAYER DEPOSITION

CROSS-REFERENCE TO RELATED APPLICATIONS

This application is a U.S. National Stage application under 35 U.S.C. §371 of International Application PCT/NL2011/050112 (published as WO 2011/102718 A1), filed Feb. 17, 2011 which claims priority to Application EP 10154037.5, filed Feb. 18, 2010. Benefit of the filing date of each of these prior applications is hereby claimed. Each of these prior applications is hereby incorporated by reference in its entirety.

FIELD OF THE INVENTION

The invention relates to a process and device for depositing a patterned layer on a substrate.

BACKGROUND

Area selective atomic layer deposition (ALD) is a technique for depositing layers with a thickness of a predetermined number of atoms. Area selective atomic layer deposition (ALD) is described in an article by Xirong Jiang et al., titled "Area Selective ALD with Soft Lithographic Methods: Using Self-Assembled Monolayers to Direct Film Deposition", published in the Journal of Phys. Chem. C 2009, 113, pages 17613-17625. Jiang et al describe a process wherein a self assembled monolayer (SAM) is applied to a substrate in a two dimensional pattern with a printing stamp. Subsequently, ALD is used to apply an atomic layer on the substrate. That is, a number of different gasses are successively fed to the substrate and removed, so that first atoms from the first gas attach to the substrate selectively where the SAM is absent and subsequently successive atoms from subsequent gasses attach to the atoms from the previous gas on the substrate where they are present. Gas components are used that attach only to the atoms from the previous gas, so that the thicknesses of the resulting layers each are no more than one atom. WO2009/061199 discloses a number of SAMs.

The ALD process takes considerable time, for applying each gas, waiting until the atoms from the gas have attached to the entire available surface, evacuating the gas and repeating with the next gas.

US2009/0081827 discloses an ALD process for forming a patterned thin film, wherein a deposition inhibitor material is applied to a substrate and patterned after or during deposition, so that selected areas of the substrate have do not have deposited inhibitor material. Subsequently an inorganic film material is deposited in the selected areas. The document describes that patterning can be done by any method known in the art, including photolithography using photo-resists, laser ablation etc. An example is described wherein of exposure for 5-15 minutes through a photomask and developing the exposed sample for 45-90 seconds in toluene, followed by rinsing. Another example uses a direct printing process using an elastomeric stamp with a patterned relief structure, which was held in contact with the substrate for 3 minutes. A further example involved inkjet printing after placing the substrate in the sample holder of an inkjet printer, followed by a 10 minute annealing step.

The pattern of inhibitor material is applied in preparation for the process of depositing the inorganic film. When the substrate is subsequently exposed to inorganic film material in a deposition apparatus, the inorganic film material attaches only to the areas without inhibitor. US2009/0081827 discloses that the substrate can be exposed to the inorganic film material by means of a floating delivery head that outputs a number of different gases via output channels facing the substrate. The gases include two species of reactive gas and an inert purge gas. The delivery head floats above the surface of the substrate, and the substrate and the floating head are moved relative to each other in a direction parallel to the surface of the substrate in a reciprocating way.

WO 2008/027125 discloses an integrated apparatus for performing substrate surface treatment and film deposition for copper interconnect. The apparatus comprises a chamber in which a plurality of proximity heads for dispensing treatment gas. An embodiment is described wherein the treatment gas is excited before it is dispensed. The document describes that the treatment gas can be excited by a hot filament, by UV, a laser or by a plasma.

In a co-pending, unpublished patent application No PCT/NL/2009/050511, assigned to the same assignee as the present patent application a device and method for applying gasses to a substrate has been described that apply a precursor gas using an injector head that hovers over a substrate by means of a gas bearing. This co-pending patent application No PCT/NL/2009/050511 is incorporated herein by reference.

Use of SAMs for photolithography has been discussed in an article by Hiroyuki Sugimura et al, titled "Photolithography based on organosilane self-assembled monolayer resist" and published in Electrochimica Acta 47, (2001) pages 103-107. Sugimura et al note that SAMs detach from a substrate under Vacuum Ultraviolet light. More generally, SAMs may detach under UV light or even under light at other wavelengths.

SUMMARY

Among others, it is an object to provide for a method and device for depositing a patterned layer on a substrate that reduces the time needed for depositing the layer.

A method of manufacturing a substrate with a patterned layer of deposited material is provided wherein, the patterned layer is deposited from a processing head, the method comprising applying bearing gas from the processing head to keep the processing head hovering over the substrate on a gas bearing;

moving the substrate and the hovering processing head relative to each other;

applying a primer material for selective deposition of a deposition material to the substrate, the primer material being applied from a first area of a surface of the processing head that faces the substrate, and spatially patterning the primer on the substrate after or during application;

applying the deposition material to the substrate from a second area of the surface of the processing head that faces the substrate, the second area lying downstream of the first area in a direction of the movement of the substrate relative to the processing head.

This makes it possible to define a patterned layer on the substrate using a continuous process, without need to change the gases in process chambers to perform different processing steps. As used herein a primer material may be a material on which the deposited material attaches, the deposited material not attaching to exposed parts of the substrate. Alternatively, the primer material as used herein may be a negative primer material, on which the deposited material does not attach, the deposited material attaching to exposed parts of the substrate. The patterned layer may have a conventional two-dimensional pattern which depends on position along the surface of the substrate in the direction of transport and in the direction along the surface of the substrate transverse to the direction of transport.

In an embodiment the substrate and the hovering processing head are moved continuously at constant speed relative to each other during deposition of both the primer material and the deposition material. Thus a simple process is realized. In an embodiment the first and second areas may have unequal diameters in the transport direction, with a ratio between the diameters that corresponds to a ratio between deposition speeds in the areas.

In an embodiment a patterned light may be applied from the processing head between the first and second area. When a photosensitive primer material is used, this may be used to pattern the primer material on the substrate without leaving the processing head. Alternatively, inkjet printing techniques may be used to apply the primer material in a patterned way already from the beginning when the primary material is applied. This may result in a coarser structure, but in both cases contact forces between the processing head and the substrate are avoided.

In an embodiment the patterned layer is applied using a multistep atomic layer deposition (ALD) process. In this case a plurality of areas may be provided in series on the processing head, to supply components of successive atomic layers from the processing head. Thus a multilayer may be grown in one continuous process. The first deposition material may be selected to attach to the primer material on the substrate and not to the exposed substrate (or to the exposed substrate and not to the primer), but not to the deposited material on the substrate and the further deposition material being selected to attach to the deposition material on the substrate but not to the further deposited material on the deposited material and to the primer material (or the exposed substrate).

In an embodiment suction is applied from openings at positions in the surface of the processing head that faces the substrate, the positions being located along an edge of the second area. In this way, deposition gas may be prevented from reaching adjacent areas. Similar suction openings may used around the edge of the lithographic recess and/or the recess for applying primer material.

In an embodiment, a further area is provided in the processing head that is used to supply an etching plasma. Thus etching can be performed in one continuous process with patterning and deposition.

A transport mechanism may be used wherein respective parts of the substrate are wound on a first and second roll and the substrate is produced by rolling it progressively from one roll to the other. The processing head makes it possible to use such a simple transport mechanism.

A device for manufacturing a substrate with a patterned layer of deposited material is provided, the device comprising optionally in combinations with the features of any of claims 8-13:

a processing head with a gas bearing surface;
   a transport mechanisms arranged to transport a substrate and the processing head relative to each other, with the gas bearing surface facing the substrate, the gas bearing surface comprising
   a first area with a recess or a set of openings coupled to a first gas source for applying a primer material to the substrate;
   a second area with a recess or a set of openings coupled to a second gas source for applying a deposition material to the substrate;
   gas bearing openings surrounding the first and second areas.

BRIEF DESCRIPTION OF THE DRAWING

These and other objects and advantageous aspects will become apparent from a description of exemplary embodiments, using the following figures.

DETAILED DESCRIPTION OF EXEMPLARY EMBODIMENTS

Figure 1:
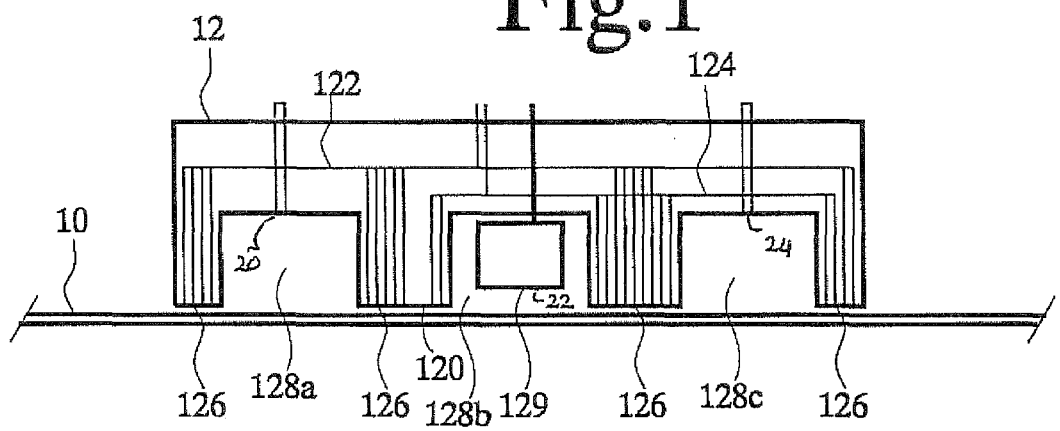
FIG. 1 shows a cross section of a processing head

FIG. 1 shows a substrate 10 and a cross-section of a processing head 12 that hovers over the substrate by means of a gas bearing. Processing head 12 has a base surface 120 and processing head 12 contains gas conduits 122, 124 ending in openings 126 in base surface 120, for supplying and removing gas to and from a layer below base surface 120. Gas conduits 122, 124 may be coupled to a source of bearing gas (not shown) and a pump (not shown).

A first, second and third recess 128a-c are provided serially in base surface 120 (i.e. in the body of processing head 12), separated by respective sets of rows of openings 126. Although circular openings are shown, it should be appreciated that the openings may have any form, such as elongated slits. used First and third recess 128a, b have gas supply inputs coupled to sources of process gasses (not shown). Second recess 128b comprises a sliding lithography device 129. Further sets of rows of openings 126 are provided adjacent first and third recess 128a-c, so that sets of rows of openings 126 are present on either side of each of first, second and third recess 128a-c.

Figure 2:
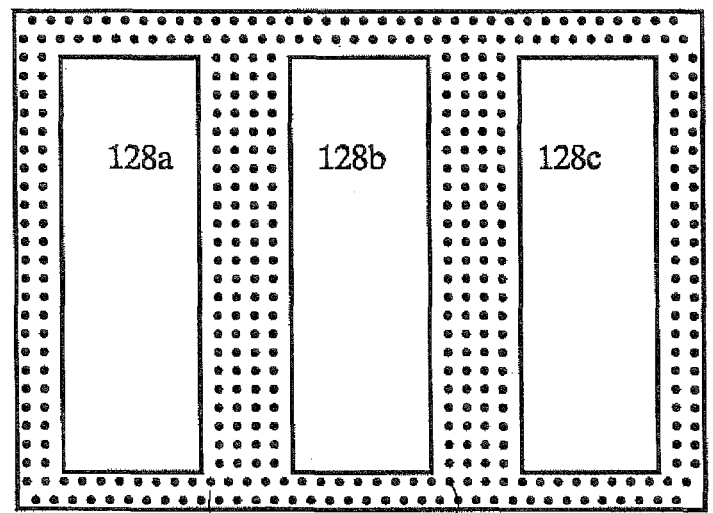
FIG. 2 shows a base surface of a processing head
FIG. 3a,b show a further processing head

FIG. 2 shows base surface 120, containing openings 126 and recesses 128a-c, each of first, second and third recess 128a-c being surrounded by rows of openings 126. The size and position of openings 126 is only shown schematically. In practice, the openings will be much smaller and more densely placed.

First recess 128a has an inlet opening 20 or inlet openings for a SAM precursor gas. Second recess 128b contains the output 22 of a device for sliding lithography. Third recess 128c has an inlet opening 24 or inlet openings for a deposit precursor gas.

In operation substrate 10 and processing head 12 are moved relative to one another while processing head hovers over substrate 10 by means of a gas bearing. Bearing gas is applied to conduits 122 for supplying gas, to create a bearing gas pressure between at least part of base surface 120 and substrate 10. Nitrogen (N2) or another inert gas may be used as a bearing gas for example.

The force of gravity may exert a force on processing head 12 towards substrate 10 and the pressure of the bearing gas resists this force, causing base surface 120 of processing head 12 to remain at a small distance from substrate 10. The force on processing head 12 towards substrate 10 may also be asserted by other means than by gravity, such as a spring or an electromagnet etc. In another embodiment processing head 12 may be located below substrate 10 or facing substrate 10 when the surface of substrate 10 is not directed horizontally.

Substrate 10 and processing head 12 may be moved relative to one another in a direction to expose positions on substrate 10 successively to first, second and third recess 128*a-c*. Preferably, continuous motion, more preferably at substantially constant speed is used. For example, substrate 10 may be moved at a constant speed relative while processing head 12 is kept in a fixed position. The relative movement causes a position on substrate 10 to be exposed successively to first, second and third recess 128*-c*.

When the position is exposed to first recess 128*a*, a self-assembled monolayer (SAM) forms on the position. Any SAM may be used, for example the SAMs disclosed in the article by Jiang et al and/or its references, including for example ODTS, SiMeCl3, SiMe2Cl2 (DMDCS), SiMe3Cl, SiMe3Br, SiMe3I, HMDS, n-BuSiCl3, iso-BuSiCl3, tert-BuSiCl3, Benzyl-SiCl3, ODTM, ODTE, FOTS. Abbreviations used are octadecyltrichlorosilane (ODTS), hexamethyl disilazane (HDMS), octadecyltrimethoxysilane (ODTM, (CH3(CH2)17Si(OCH3)3)), octadecyltriethoxysilane (ODTE), and tridecafluoro-1,1,2,2-tetrahydrooctyltrichlorosilane (FOTS). As another example, the SAMs disclosed in WO2009/061199 may be used. These SAMs are incorporated herein by reference.

Subsequently, when the position is exposed to second recess 128*b*, the SAM is locally removed by exposure to light. SAM removal by lighting is known per se. Sliding lithography may be used to provide a position dependent exposure intensity on substrate 10. Sliding lithography may be realized for example by means of a light source that provides light in a plane transverse to the direction of movement of substrate 10 (e.g. perpendicular to that direction) and a transport mechanism for mask through said plane linearly in a direction opposite to the movement of substrate 10. Imaging optics may be provided to image the mask onto substrate 10. In another embodiment, a laser beam scanner and a laser modulator may be used, with a control circuit configured to control modulation of the laser intensity dependent on information representing a desired exposure pattern and to scan the laser beam in a plane transverse to the direction of movement of substrate 10, for example by means of a rotating mirror that reflects the laser beam. In another embodiment a linear array of light sources, such as a linear array of LEDs may be used to realize sliding lithography with a control circuit configured to control intensity modulation of the light sources dependent on information representing a desired exposure pattern. A plurality of such arrays may be used in parallel, the same intensity being applied successively to successive arrays in correspondence with movement of substrate 10 to provide for a longer exposure time. In another embodiment e-beam lithography may be used. Instead of a SAM other materials may be used, laser ablation being used to remove these materials in a patterned way with the laser beam scanner. A sliding lithographic exposure device, with imaging optics to image a mask on the surface, or a beam scanner with an intensity modulator are examples of pattern writing devices that can be used in head 12, or operate in combination with head 12. These pattern writer devices provide for definition of a two-dimensional pattern which depends on position along the surface of the substrate in the direction of transport and in the direction along the surface of the substrate transverse to the direction of transport.

Next, when the position is exposed to third recess 128*c*, material is deposited that attaches selectively only at positions on substrate 10 that have been exposed by the local removal of the SAM. (In an alternative embodiment material may be deposited that attaches selectively only to the SAM leaving open positions on substrate 10 that have been exposed by the local removal of the SAM). Suction is applied to a part of the conduits 124 adjacent the edge of second recess 128*b*, to remove SAM particles that are detached from the surface by the lithography.

FIG. 3*a,b* show a further processing head, comprising five recesses 30*a-e*, each surrounded by openings of gas conduits 122, 124 in base surface 120. A first recess 30*a* has an inlet opening 20 or inlet openings for a SAM precursor gas. A second recess 30*b* contains the output 22 of a device for sliding lithography. A third and fourth recess 30*c,d* have inlet openings 32, 34 or inlet openings for a first and second ALD gas. Examples of possible ALD gases are described in the article by Jiang et al and its references and these examples are incorporated herein by way of reference. A fifth recess 30*e* is used to apply a plasma for etching material from substrate 10. Materials for use in Etch plasmas and plasma generators are known per se and may be selected dependent on the material that must be etched and the material that must be left on substrate 10. Fifth recess 30*e* may contain electrodes or a coil for generating a radio frequency electromagnetic field and an inlet opening for a gas that will be excited to form a plasma.

In operation, the processing head of FIGS. 3*a,b* may be used in the same way as that of FIGS. 1 and 2, but with additional processing steps. A first and second gas, for supplying first and second components of a layer deposited by ALD, may be supplied in third and fourth recess 30*c,d* respectively. The exposed SAM may be selectively removed by plasma etching in fifth recess 30*e*. Suction may be applied to a part of the conduits 124 adjacent the edge of third and fourth recess 30*c,d*, to prevent flow of components between the recesses. Similarly, suction may be applied to a part of the conduits 124 adjacent the edge of fifth recess 30*e*.

It should be appreciated that more recesses in the base surface may be used, to provide for additional deposition step. More recesses like second recess 128*b* for applying further lithographic steps, or recess for other non-deposition steps like plasma etching may be added. Of course plasma etching could be omitted if there is no need to remove the SAM layer.

Figure 4:
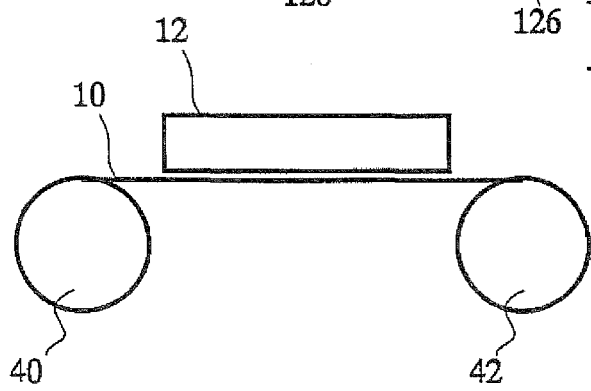
FIG. 4 shows a transport arrangement

FIG. 4 shows an arrangement wherein substrate 10 is a bendable foil supplied from a first rotatable roll 40 to a second rotatable roll 42, processing head 12 hovering over substrate 10 at a position where it is exposed during transport from first roll 40 to a second roll 42. A motor may be provided to rotate second rotatable roll 42 and/or first roll 40, or motors may be provided to rotate the respective rolls. In other embodiment a conveyor (e.g. with a conveyor belt) may be used to transport the substrate 10 past processing head 12, or a transportable carrier supporting substrate 10 may be used that is moved past processing head. In another embodiment processing head may be placed on the moving part of a linear motor for example or on a conveyor.

As will be appreciated the illustrated embodiments provide for a composite process that results in a patterned layer on the substrate without requiring any fixed connection between the processing head 12 and the substrate. The processing head 12 is able to operate at atmospheric ambient pressure. The gas condition in the recesses (gas pressure, gas composition) may be kept constant, without need for evacuation of a recess between different processing steps, so that evacuation of the recess cannot be compromised by ambient atmospheric pressure. The narrow spacing between substrate 10 and the base surface 120 of processing head 12 filled with bearing gas, and if desired combined with suction openings coupled to suction conduit 124, may be sufficient to exclude detrimental effects of ambient conditions.

The air bearings allow for accurate position control of processing head 12 relative to substrate 10. Substrate 10 may be provided with guide marks for example and a position control loop may be provided that comprises a guide mark sensor (e.g. an optical sensor, such as an image sensor or an interferometric sensor) and position actuator such as a linear motor to control lateral positioning of processing head 12 relative to substrate 10 in a direction transverse to the main continuous relative motion of processing head 12 relative to substrate 10. The speed of continuous motion may be controlled by a similar type of feedback loop. A further feedback loop may be used to control the distance between the base surface 120 of processing head 12 and substrate 10. This further feedback loop may comprise a distance sensor (an optical interferometer for example) and an actuator that applies a controllable force on processing head 12 in a direction towards substrate 10.

In the illustrated embodiments an all gas-phase process is provided (as used herein the term gas includes vapor). The SAM is deposited on substrate 10 from a gas phase, and locally removed from substrate 10 into a gas phase and material is deposited in third recess 128c, 30c and optional further recesses from a gas phase. Optional etching of the SAM is performed by a plasma gas. In this way, mechanical forces exerted between processing head 12 and substrate 10 are minimized, simplifying processing. Conventional photoresist processing, involving application of photoresist, exposure etching of the photoresist etc are not needed.

In an embodiment process liquid may be supplied to one or more of the recesses, for example to third recess 128c. The may be used to perform electroless metallization. In this case the gas bearing with openings around the edge of the recess also serves to confine the liquid to the recess. Optionally, suction openings adjacent the edge of the recess may be used to remove excess process liquid.

Although an embodiment has been shown wherein material is deposited onto substrate 10 from recesses, it should be appreciated that a recess may be replaced by an array of further openings in an area of base surface 120, to supply gases with atoms for deposition much in the same way as in which the bearing gas is supplied. That is, an area of base surface 120 with a recess or an area of base surface 120 with an array of openings may be used to supply deposition material. However, the use of a recess that opens to the entire area of the substrate that must be processed has the advantage that the influence of bearing gas can be reduced.

Although an embodiment has been shown wherein the areas for supply of deposition material, such as recesses 128a,c, 30a,c,d, and other recesses have equal diameters in the direction of movement, it should be appreciated that the diameters may differ. For example when attachment of deposition material in a first area takes substantially longer than attachment of another deposition material in a second area, the diameter of the first area may be made larger than that of the second area, in proportion to the ratio of the time durations that are needed for attachment. The diameters of the recesses for plasma etching and lithography may similarly be made smaller or larger. In addition, the gas supply to one or more of the recesses as well as the exposure may be operated in a non-continuous mode (switching on/off).

In an embodiment SAM deposition followed by lithography may be replaced by inkjet printing technique using a SAM material instead of ink. Thus first and second recess 128a,b may be replaced by one recess. In this embodiment head 12 contains an inkjet printer that operates through the one recess, the inkjet printer being configured to print a pattern using SAM material as "ink". A printing head with a plurality of inkjet outputs arranged along a line transverse to the direction of movement of the substrate may be used, or a printing head coupled to an actuator may be used, the actuator being configured to scan the printing head along such a line.

In an embodiment patterning using first and second recess 128a,b, using SAM deposition followed by lithography has been replaced by printing. An embodiment of this processing head uses a patterned printing roll and a bath of SAM precursor, i.e. that head contains a printing roll containing a printing pattern on its surface and a bath in the path of the surface of the printing. In each revolution of the printing roll its surface passes successively through the bath to substrate 10. After the bath the surface of the printing roll remains selectively wetted, according to the printing pattern on the printing roll. A predetermined static pattern may be used, or a pattern that is written dynamically onto printing roll during the revolutions. Dynamic printing roll pattern writers (e.g. electrostatic pattern writers) are known per se from printing technology such as photocopiers. As will be appreciated the use of a printing roll implies that the printing roll exerts a contact force acting between substrate 10 and processing head. This requires caution when the printing is combined with gas bearings, but it may be possible to manufacture coarse patterns. A printer, such as an inkjet printer or a printer with a printing roll, are further examples of implementations of a pattern writing device that can be used in head 12. The pattern writer device provides for definition of two-dimensional patterns. However, any type of pattern writing device may be used that provides for the definition of such position dependent patterns.

Although an example has been shown wherein SAM deposition and ALD have been used, it should be realized that other materials may be used. Any material that can be removed by light, for example by heating or light activated chemical modification may be deposited instead of SAM material. Similarly, any material that selectively attaches to a deposited layer and not to substrate, or vice versa, may be used in a second deposition step. The use of a Sam and ALD has the advantage that very small scale patterns can more easily be manufactured.

When a substrate is used to which the deposition material of third recess 128c attaches, a SAM or alternative material may be used to which the deposition material does not attach. When a substrate is used to which the deposition material of third recess 128c does not attach, a SAM or alternative layer may be used to which the deposition material does attach. In the latter case the SAM or alternative layer may remain on substrate 10.

The invention claimed is:
1. A device for manufacturing a substrate with a patterned layer of deposited material, the device comprising
  a processing head having a gas bearing surface;
  a transport mechanism configured for providing relative movement between a substrate and the processing head, by causing a position on the substrate to be exposed successively to a first, a second, and a third area of the processing head;
  wherein the first area includes a first area recess or a first area set of openings coupled to a primer material supply input for applying primer material to the substrate;
  wherein the second area includes a pattern writer;
  wherein the third area includes a third area recess or third area set of openings coupled to a deposition material supply input for applying deposition material to the substrate;
  wherein the pattern writer is configured to spatially pattern the primer material on the substrate, after the primer material is applied to the substrate when exposed to the first area, and before the deposition material is applied to the substrate, when successively exposed to the third area.

2. A device according to claim 1, wherein the pattern writer is an optical pattern writer comprising a light source configured to provide, from the second area of the processing head, an exposure pattern onto the primer material.

3. The device of claim 2, wherein the optical pattern writer comprises a laser beam scanner, a laser modulator, and a control circuit configured to provide, from the second area of the processing head, the exposure pattern onto the primer material.

4. The device of claim 2, wherein the optical pattern writer comprises an array of LEDs and a control circuit configured to provide, from the second area of the processing head, the exposure pattern onto the primer material.

5. A device according to claim 1, wherein the processing head comprises a fourth area, including a fourth area recess, or a fourth area set of openings coupled to a further deposition material supply input for applying further deposition material to the substrate, the further fourth area recess positioned downstream of the third area, according to a direction of the relative movement imparted by the transport mechanism.

6. A device according to claim 5, wherein the processing head further comprises a plasma source located in or coupled to a fifth area recess in the gas bearing surface, the fifth area recess positioned downstream of the fourth area, according to a direction of the relative movement provided by the transport mechanism.

7. The device of claim 6, wherein the fifth area recess comprises electrodes or a coil for generating a radio frequency electromagnetic field and coupled to the plasma source.

8. A device according to claim 1, wherein the processing head further comprises suction openings disposed along at least one edge of the third area of the gas bearing surface.

9. The device of claim 8, wherein the processing head further comprises suction openings disposed along at least one edge of the first area of the gas bearing surface or along at least one edge of the second area of the gas bearing surface.

10. A device according to claim 1, wherein the transport mechanism comprises a first and second roll, for rolling off and on the substrate respectively, the processing head being located along a substrate transport path from the first roll to the second roll.

11. A device according to claim 1, wherein the first area includes the first area recess and the third area includes the third area recess, the primer material supply input and the deposition material supply input being coupled to the first and third area recesses respectively.

12. A device for manufacturing a substrate with a patterned layer of deposited material, the device comprising
a processing head having a gas bearing surface including first and second areas;
a transport mechanism configured for providing relative movement between a substrate and the processing head, by causing a position on the substrate to be exposed successively to the first and the second areas;
wherein the first area includes a first area recess coupled to a primer material supply input for applying primer material to the substrate;
wherein the second area includes a second area recess or second area set of openings coupled to a deposition material supply input for applying deposition material to the substrate;
the processing head further comprising a printing head that is disposed within the first area recess of the processing head and configured to receive primer material through the primer material supply input, the printing head further configured to spatially pattern the primer material on the substrate, when the primer material is applied to the position of the substrate exposed to the first area and before the deposition material is applied to the position of the substrate, when successively exposed to the second area.

13. The device of claim 12, wherein the printing head is used in an inkjet printer contained within the first area recess.

14. The device of claim 12, wherein the printing head comprises a patterned printing roll configured to receive primer material from a bath supplied from the primer material supply input.

15. The device of claim 12, wherein the processing head comprises a third area, including a third area recess, or a third area set of openings coupled to a further deposition material supply input for applying further deposition material to the substrate, the third area recess positioned downstream of the second area, according to a direction of the relative movement imparted by the transport mechanism.

16. The device of claim 15, wherein the processing head comprises a fourth area, including a fourth area recess coupled to a plasma input for forming an etching plasma, the fourth area recess positioned downstream of the third area, according to a direction of the relative movement imparted by the transport mechanism.

17. The device of claim 12, wherein the processing head further comprises suction openings disposed along at least one edge of the second area of the gas bearing surface.

18. The device of claim 17, wherein the processing head further comprises suction openings disposed along at least one edge of the first area of the gas bearing surface.

19. The device of claim 12, wherein the transport mechanism comprises first and second rotatable rolls, configured to provide the relative movement between the substrate and the processing head.

20. The device of claim 12, wherein the transport mechanism comprises a conveyor belt, configured to provide the relative movement between the substrate and the processing head.

* * * * *